(12) United States Patent
Sasaki

(10) Patent No.: US 6,842,880 B2
(45) Date of Patent: Jan. 11, 2005

(54) SEMICONDUCTOR INTEGRATED CIRCUIT DESIGNING METHOD AND SEMICONDUCTOR DEVICE

(75) Inventor: Yoshinobu Sasaki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 166 days.

(21) Appl. No.: 10/098,441

(22) Filed: Mar. 18, 2002

(65) Prior Publication Data

US 2003/0084408 A1 May 1, 2003

(30) Foreign Application Priority Data

Oct. 30, 2001 (JP) ........................................ 2001-332994

(51) Int. Cl.[7] ............................................ G06F 17/50
(52) U.S. Cl. ......................................................... 716/1
(58) Field of Search ............................................. 716/1

(56) References Cited

U.S. PATENT DOCUMENTS

| | | | | | |
|---|---|---|---|---|---|
| 3,678,416 | A | * | 7/1972 | Burwen | 333/17.1 |
| 4,025,873 | A | * | 5/1977 | Chilluffo | 330/277 |
| 4,590,613 | A | * | 5/1986 | Tannery, IV | 455/200.1 |
| 4,661,789 | A | * | 4/1987 | Rauscher | 333/202 |
| 4,754,229 | A | * | 6/1988 | Kawakami et al. | 330/277 |
| 6,252,461 | B1 | * | 6/2001 | Raab | 330/302 |
| 6,552,634 | B1 | * | 4/2003 | Raab | 333/216 |

FOREIGN PATENT DOCUMENTS

| | | |
|---|---|---|
| JP | 62-100006 | 5/1987 |
| JP | 4-364082 | 12/1992 |

OTHER PUBLICATIONS

"20–30 GHz Broadband MMIC Power Amplifiers With Compact Flat Gain pHEMT Cells", 2001 IEEE MTT-S International Microwave Symposium Digest, May 2001, pp. 1067–1070.
"20–30 GHz Broadband MMIC Power Amplifier With Compact Flat Gain pHEMT Cells", Proceedings of the 2001 Electronics Society Conference of IEICE, Electronics Society, The Institute of Electronic, Information and Communication Engineers, Aug. 29, 2001, p. 52.

* cited by examiner

Primary Examiner—Stacy A. Whitmore
(74) Attorney, Agent, or Firm—Leydig, Voit & Mayer, Ltd.

(57) ABSTRACT

A transistor cell is designed by combining a transistor with passive elements such as a resistor, a capacitor, and an inductor. The parameters of the passive elements are determined so that the transistor cell has a maximum available gain characteristic that is flat in a desired frequency range. Matching circuits for input/output impedance matching for the transistor cell are designed so that loss occurring in the matching circuits has a flat frequency characteristic. A semiconductor integrated circuit is designed by combining the transistor cell and the matching circuits thus designed.

13 Claims, 7 Drawing Sheets

23  21  22  21  22  21  24 transistor matching circuit

SEMICONDUCTOR INTEGRATED CIRCUIT DESIGNING METHOD AND SEMICONDUCTOR DEVICE

BACKGROUND OF THE INVENTION

1. Field of the Invention

The present invention relates to a method of designing a semiconductor integrated circuit such as an MMIC (microwave monolithic integrated circuit) that operates in a radio frequency range, as well as to a semiconductor device designed by such a designing method.

2. Description of the Related Art

First, a conventional semiconductor device designing method will be described with reference to FIGS. 8A–8C. FIG. 8A is a design diagram of an amplifier. In FIG. 8A, reference numeral 101 denotes a transistor; 102, a matching circuit; 103, an input terminal of the amplifier; and 104, an output terminal of the amplifier. Power that is supplied to the input terminal 103 of the amplifier is amplified stage by stage by the plurality of transistors 101 and amplified power is output from the output terminal 104. The matching circuits 102 provide input/output impedance matching for the transistors 101.

In designing of the amplifier, usually, the circuit configurations of the matching circuits 102 are determined so as to conform to the characteristic of the transistors 101 so that the transistors 101 can fully exercise their capabilities. Desirably, the layout of the elements on the substrate constituting each matching circuit 102 is designed properly to reduce the circuit area.

FIG. 8B is a graph of an exemplary maximum available gain (MAG) characteristic of each transistor 101, in which the horizontal axis represents the frequency. In a low-frequency range where each transistor 101 does not satisfy a stability condition (stability factor K>1), the maximum available gain cannot be defined. In FIG. 8A, a maximum stable gain (MSG) characteristic is shown as a measure in such a low-frequency range.

In designing the amplifier based on the design diagram of FIG. 8A, the matching circuits 102 are so designed as to have a loss in the low-frequency range where the stability factor K of the transistor 101 is smaller than 1, to thereby establish the stability factor K of the amplifier to be equal to 1 to prevent the amplifier from oscillating. Where the transistors 101 have a characteristic shown in FIG. 8B, the matching circuits 102 are designed to have the characteristic shown in the graph of FIG. 8C, for example. As a result, in a desired frequency range, the characteristic of the transistors 101 and that of the matching circuits 102 compensate each other, whereby a flat gain characteristic is attained for the amplifier as a whole.

However, if it is necessary to attain both the input/output impedance matching (original purpose of the matching circuits) and the gain flattening by compensating the characteristic of the transistors, the designing of the matching circuits becomes very difficult. There is another problem. Whereas the gain of each transistor varies with the frequency, the output power of each transistor is almost constant with respect to the frequency. Therefore, if the matching circuits are designed so that the loss occurring there varies with frequency, the output power of the amplifier cannot be kept constant though its gain can be kept constant. As described above, it is very difficult to control the characteristics of the matching circuits 102 so that the amplifier has a gain and output power that are kept constant in a stable manner.

Incidentally, with the recent increase of demand relating to communication that is particularly remarkable in LMDS (local multipoint distribution service), the need for low-cost MMICs is now increasing. For cost reduction, it is necessary to increase the frequency range of stable operation as well as to properly design a layout to minimize chip area.

SUMMARY OF THE INVENTION

An object of the present invention is therefore to propose a method for designing a semiconductor integrated circuit having a stable, constant gain in a wide frequency range easily without imposing undue load on a designer, to thereby provide a high-quality, low-cost semiconductor device capable of operating in a wide frequency range.

The invention provides a designing method of a semiconductor integrated circuit that operates in a wide frequency range. The method includes these steps. First a transistor cell is designed as a combination of a transistor and prescribed elements by determining the prescribed elements so that the transistor cell has a maximum available gain characteristic that is flat in a desired frequency range. Next matching circuits are designed which serve for input and output impedance matching for the transistor cell so that a loss occurring in the matching circuits has a flat frequency characteristic. Next a semiconductor integrated circuit is designed by combining the transistor cell and the matching circuits.

A semiconductor device according to the invention is one whose circuit is designed by the above designing method. That is, the invention provides a semiconductor device having a semiconductor integrated circuit that operates in a wide frequency range. The semiconductor integrated circuit includes a transistor cell including a transistor and prescribed elements, the prescribed elements being determined so that the transistor cell has a maximum available gain characteristic that is flat in a desired frequency range. The circuit also includes matching circuits which serve for input and output impedance matching for the transistor cell. The matching circuits is designed so that a loss occurring there has a flat frequency characteristic.

It is preferable that the transistor cell be so designed that its maximum available gain characteristic is flat in the desired frequency range to such an extent that a deviation is within 1 dB.

It is preferable that the transistor cell be so designed as to have a stability factor k that is greater than or equal to 1.

To exhibit the "maximum available gain characteristic that is flat in a desired frequency range," the transistor cell may have an exemplary circuit configuration that the prescribed elements constitute a feedback circuit for the transistor. In this case, it is preferable that the on-substrate layout of the transistor cell is such that at least one of the prescribed elements constituting the feedback circuit is disposed close to a drain electrode of the transistor. Alternatively, at least one of the prescribed elements constituting the feedback circuit may be disposed close to a gate electrode of the transistor.

To exhibit the "maximum available gain characteristic that is flat in a desired frequency range," the transistor cell may have another exemplary circuit configuration that a circuit of the prescribed elements is provided on the gate electrode side of the transistor. The circuit provided on the gate electrode side may be formed by connecting a capacitor in parallel to a series connection of an inductor and a resistor.

In addition to this circuit, a grounded second capacitor may be provided so as to be connected to the gate electrode.

To exhibit the "maximum available gain characteristic that is flat in a desired frequency range," the transistor cell may have still another exemplary circuit configuration that a circuit of the prescribed elements is provided on the drain electrode side of the transistor. The circuit provided on the drain electrode side may be formed by connecting a capacitor in parallel to a series connection of an inductor and a resistor.

A semiconductor device that operates as a power amplifier can be designed without imposing undue load on a designer by combining a plurality of transistor cells of the above kind with each other.

Other and further objects, features and advantages of the invention will appear more fully from the following description.

BRIEF DESCRIPTION OF THE DRAWINGS

The present invention will be more apparent from the following detailed description, when taken in conjunction with the accompanying drawings, in which.

DETAILED DESCRIPTION OF THE PREFERRED EMBODIMENT

Preferred embodiments of the present invention will be hereinafter described with reference to the accompanying drawings.

First Embodiment

Figure 1:
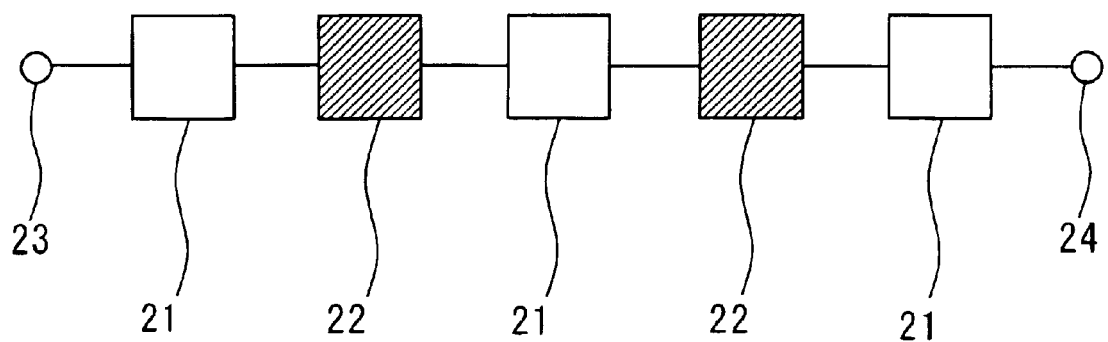
FIG. 1 shows an amplifier to be designed by a method according to the present invention.

FIG. 1 is a circuit design diagram that is used in designing an amplifier by a method according to the invention. In FIG. 1, reference numeral 21 denotes a matching circuit; 22, a transistor cell; 23, an input terminal of the amplifier; and 24, an output terminal of the amplifier. This designing method is different from the conventional one in that instead of designing the amplifier in consideration of the characteristic of a transistor itself, the transistor cell 22 that is a combination of the transistor and passive elements such as a resistor(s), a capacitor(s), and an inductor(s) is designed first and the matching circuit 22 is then designed so as to conform to the transistor cell 22.

Figure 2:
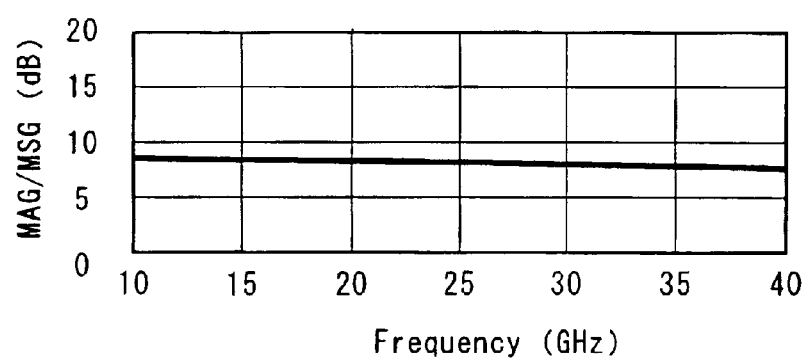
FIG. 2 is a graph showing a MAG characteristic of a transistor cell.

The circuit configuration of each transistor cell 22, that is, kinds and characteristic values (R, C, L, etc.) of passive elements, the number of passive elements of each kind, manners of connection, and other items, is so determined that the transistor cell 22 has a flat MAG characteristic in a desired frequency range. The term "flat MAG characteristic" means a characteristic having a deviation of several decibels in a desired frequency range. If possible, the transistor cell 22 is so designed that the deviation is within 1 dB. FIG. 2 is a graph showing an exemplary MAG characteristic of the transistor cell 22 according to this embodiment. The circuit configuration of the transistor cell 22 is designed so that the stability factor K of the transistor cell 22 is greater than 1 in a desired frequency range, that is, so that no oscillation occurs.

To minimize the area of the transistor cell 22, the on-substrate layout of the transistor cell 22 is designed in such a manner that a resistor(s), a capacitor(s), an inductor (s), etc. are disposed close to a transistor.

Figure 3A:
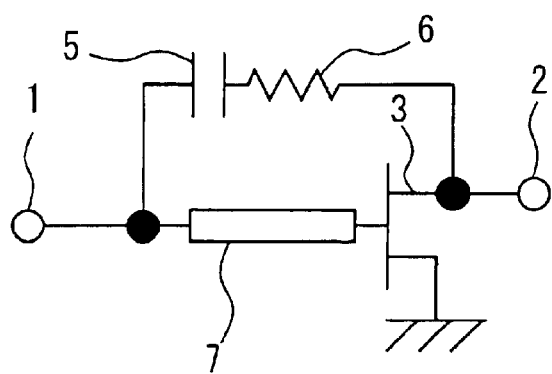
FIG. 3A shows the circuit configuration according to the first and the second embodiments.
Figure 3B:
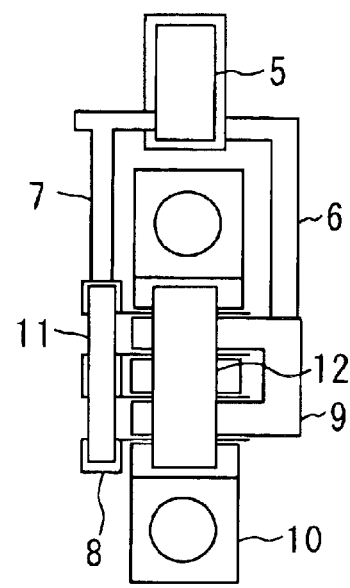
FIG. 3B shows the layouts of transistor cells according to the first embodiment.

A specific example of the transistor cell 22 that was designed by the above method will be described below. FIG. 3A shows the circuit configuration and FIG. 3B shows the on-substrate layout of a transistor cell 22 according to this embodiment. The MAG characteristic shown in FIG. 2 can be realized by the circuit configuration of FIG. 3A and the layout of FIGS. 3B.

In FIG. 3A, reference numeral 1 denotes an input terminal of the transistor cell 22; 2, an output terminal of the transistor cell 22; 3, a transistor; 5, a capacitor; 6, a resistor; and 7, an inductor. This circuit is provided with a feedback circuit for feedback from the drain output of the transistor 3 to its gate input. The feedback circuit is composed of the resistor 6, the capacitor 5, and the inductor 7. The MAG characteristic of FIG. 2 which is flat in the wide frequency range can be obtained by optimizing the resistor 6, the capacitor 5, and the inductor 7.

FIG. 3B is a plan view, as seen from above, of the circuit of FIG. 3A formed on a substrate, and shows a layout in which the feedback circuit and interconnections are formed in layers above the transistor 3 (not shown). Reference numerals 8 and 9 denote a gate electrode and a drain electrode of the transistor 3, respectively. A source electrode (not shown) of the transistor 3 is connected to the back surface of the substrate through a via hole 10. Reference numeral 11 denotes an air bridge interconnection that connects the gate electrode 8 to a circuit outside the transistor cell 22. Reference numeral 12 denotes an air bridge interconnection that connects the source electrode to a circuit outside the transistor cell 22. The capacitor 5, the resistor 6, and the inductor 7 are disposed close to the transistor 3 and serve as the feedback circuit of the transistor 3.

The transistor cell 22 itself satisfies the stability condition and has an MAG characteristic that is flat over the entire desired frequency range. Therefore, it is not necessary to stabilize the transistor cell 22 by the matching circuits 21 or compensate the frequency characteristic of the transistor 3 by the matching circuits 21. It is sufficient to design the matching circuits 21 only for the purpose of impedance matching for the transistor cell 22. Therefore, the matching circuits 21 may be low-loss circuits that provide optimum impedances that are calculated based on S parameters of the transistor cell 22. By designing a transistor cell having a flat gain characteristic first using a transistor and a feedback circuit and then combining the transistor cell with other circuits in the above-described manner, an amplifier having a flat gain characteristic in a wide frequency range can be designed easily even in the case of a multistage amplifier in which a plurality of transistors are connected to each other in cascade. This designing method is also effective for designing of semiconductor integrated circuits including transistors other than amplifiers.

Second Embodiment

Figure 3C:
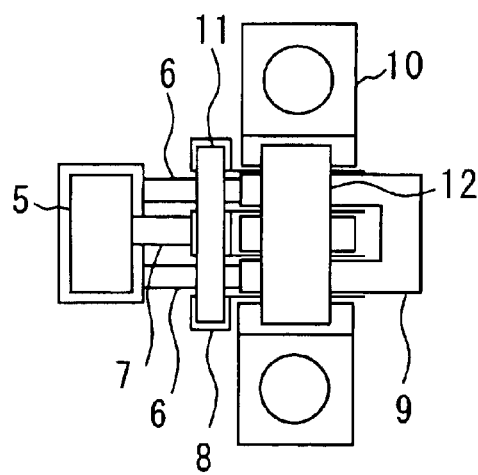
FIG. 3C shows the layouts of transistor cells according to the second embodiment.

Another example of the transistor cell 22 designed by the above method will be described below. Like FIG. 3B, FIG. 3C is a plan view, as viewed from above, of the circuit of FIG. 3A formed on a substrate. The layout of FIG. 3C is different from the above-described layout of FIG. 3B in the arrangement of the feedback circuit.

In the layout of FIG. 3C, the capacitor 5 that is part of the feedback circuit is disposed on the left of and close to the gate electrode 8. The capacitor 5 and the drain electrode 9 are connected to each other via the resistor 6. The capacitor 5 and the gate electrode 8 are connected to each other via the inductor 7.

By optimizing the elements of the feedback circuit, the transistor cell 22 according to this embodiment can be given a flat MAG characteristic in a wide frequency range even with a small circuit area as in the case of the first embodiment. Since the drain electrode 9 and the resistor 6 are arranged close to each other and the drain electrode 9 also serves as an interconnection of the feedback circuit, the transistor cell 22 can be formed in a smaller area than in the first embodiment.

Third Embodiment

Figure 4A:
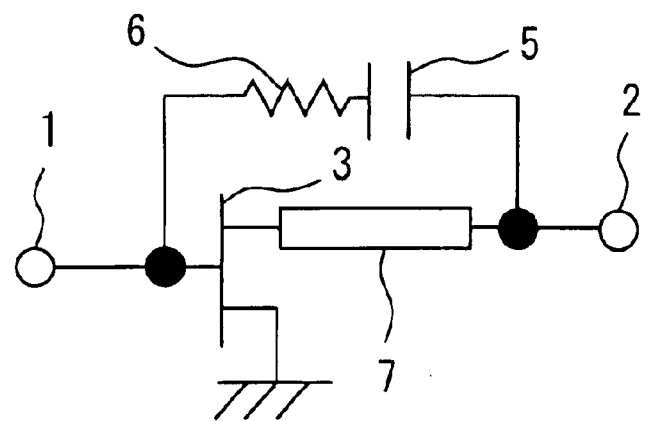
FIG. 4A shows the circuit configuration according to the third embodiment.
Figure 4B:
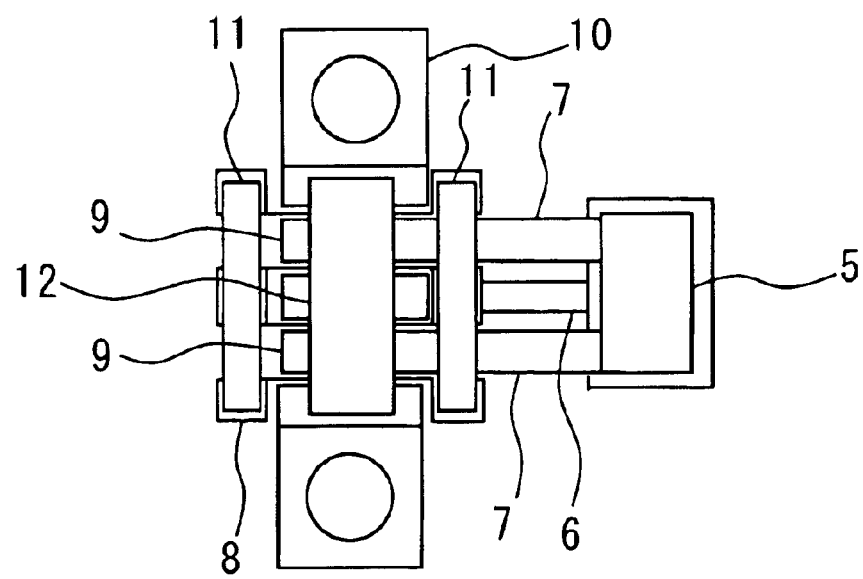
FIG. 4B shows the layout of a transistor cell according to the third embodiment.

Still another example of the transistor cell 22 designed by the above method will be described below. As in the case of the first and second embodiments, a transistor cell 22 according to this embodiment is formed in such a manner that a feedback circuit is added to a transistor 3. The transistor cell 22 according to this embodiment is characterized in that the main part of the feedback circuit exists on the drain electrode side. FIG. 4A shows the circuit configuration of this transistor cell 22 and FIG. 4B shows its layout on a substrate.

This embodiment is the same as the second embodiment in that the feedback circuit is composed of a resistor 6, a capacitor 5, and an inductor 7. However, in this embodiment, as shown in FIG. 4A, the inductor 7 is connected to the drain electrode side of the transistor 3. In terms of layout, as shown in FIG. 4B, all of the resistor 6, the capacitor 5, the inductor 7 are disposed on the drain electrode side of the transistor 3.

As in the case of the second embodiment, the transistor cell 22 according to this embodiment can be given a flat MAG characteristic in a wide frequency range even with a small circuit area by optimizing the elements of the feedback circuit. Further, since the elements of the feedback circuit cluster on the drain electrode side of the transistor 3, the transistor cell 22 according to this embodiment is favorable for a case in which a circuit to be connected to the transistor cell 22 is desired to be located on the gate electrode side of the transistor 3 because layout can be performed easily.

Fourth Embodiment

Whereas in each the above embodiments the transistor cell 22 is such that the feedback circuit is added to the transistor 3, a transistor cell 22 having a stable, flat MAG characteristic can also be designed as a circuit having the following configuration.

Figure 5A:
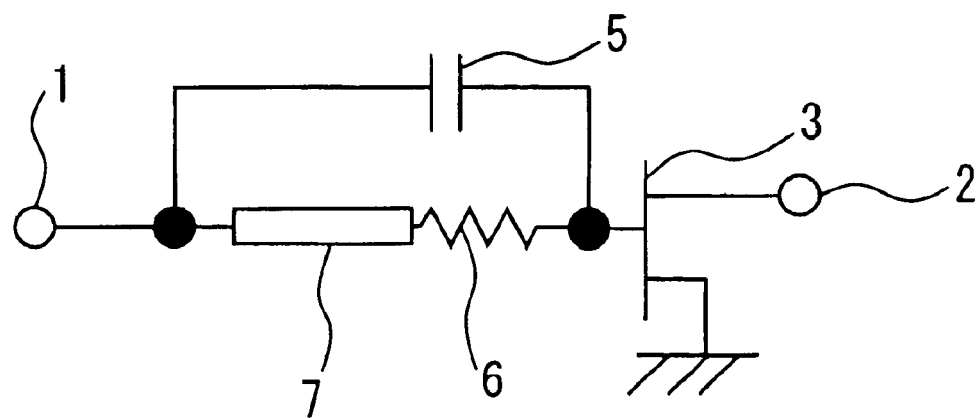
FIG. 5A shows the circuit configuration according to the fourth embodiment.
Figure 5B:
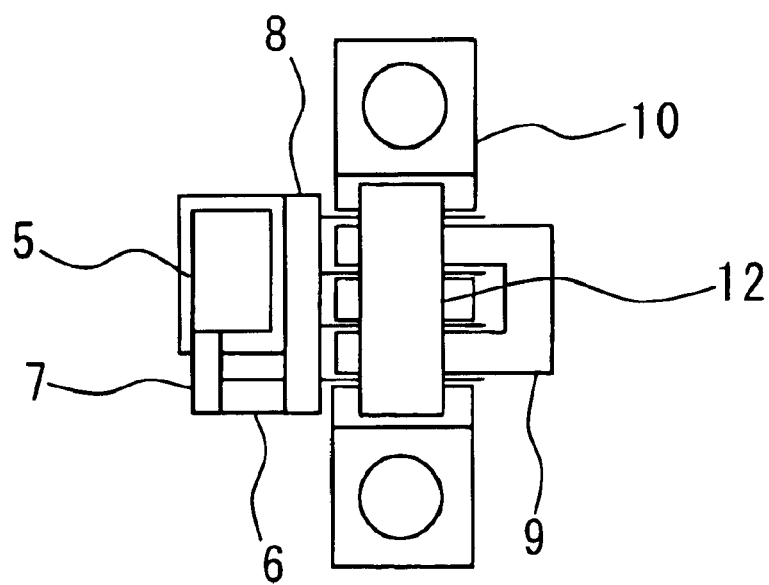
FIG. 5B shows the layout of a transistor cell according to the fourth embodiment.

FIG. 5A shows the circuit configuration of the transistor cell 22 according to this embodiment. A circuit formed by connecting a capacitor 5 and a series connection of a resistor 6 and an inductor 7 in parallel is connected to a gate electrode side of a transistor 3. FIG. 5B shows the on-substrate layout of the transistor cell 22. FIG. 5B shows how the capacitor 5, the resistor 6, and the inductor 7 are formed close to the gate electrode 8. In this circuit, a larger amount of signal comes to pass through the capacitor 5 and a smaller amount of signal comes to pass through the resistor 6 as the frequency increases. Therefore, the MAG characteristic of the transistor cell 22 is flattened.

The transistor cell 22 according to this embodiment can realize a stable, flat MAG characteristic. Since all the elements that are added to the transistor 3 can cluster close to the gate electrode 8, layout can be performed easily and the circuit area can be reduced. Further, since no loss-inducing element such as a resistor is disposed on the output side of the transistor 3, a signal can be output efficiently from the transistor 3.

Fifth Embodiment

Figure 6A:
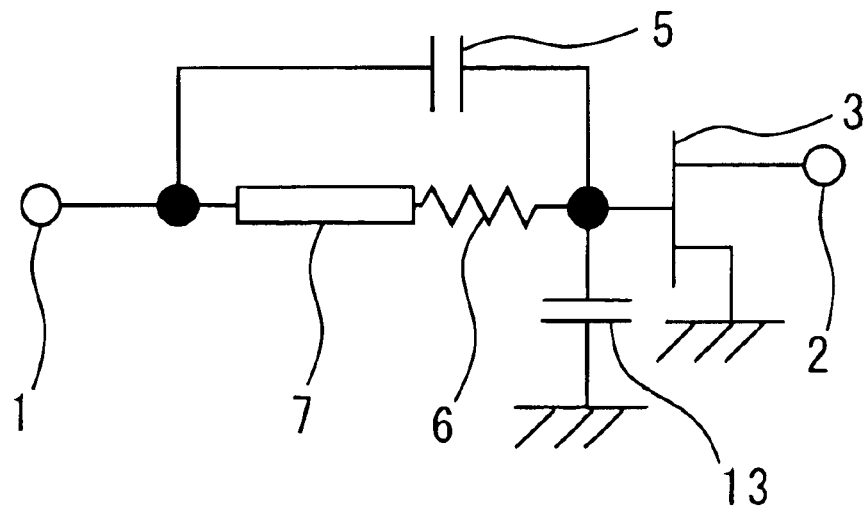
FIG. 6A shows the circuit configuration according to the fifth embodiment.
Figure 6B:
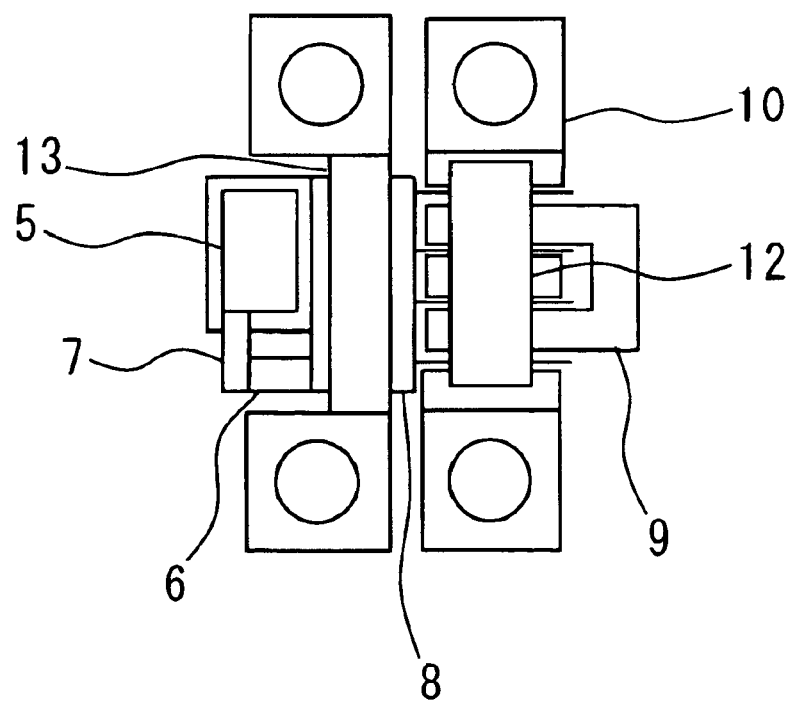
FIG. 6B shows the layout of a transistor cell according to the fifth embodiment.

FIG. 6A shows the circuit configuration of a transistor cell 22 according to this embodiment. This transistor cell 22 is obtained by adding a second capacitor 13 to the transistor cell 22 according to the fourth embodiment. As shown in FIG. 6A, the capacitor 13 is disposed on the gate electrode side of the transistor 3 in such a manner that its one end is grounded. FIG. 6B shows the on-substrate layout of this transistor cell 22. The second capacitor 13 is opposed to the gate electrode 8 and connected to the back surface of the substrate through a via hole.

The transistor cell 22 according to this embodiment operates in the same manner as that according to the fourth embodiment. However, the transistor cell 22 according to this embodiment has an advantage that by virtue of the addition of the second capacitor 13 an optimum input impedance that is almost constant over a wide frequency range can be obtained.

Sixth Embodiment

Figure 7A:
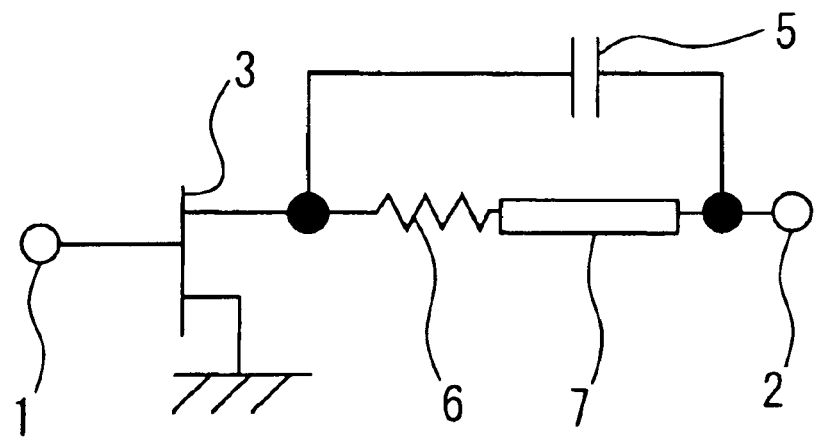
FIG. 7A shows the circuit configuration according to the sixth embodiment.
Figure 7B:
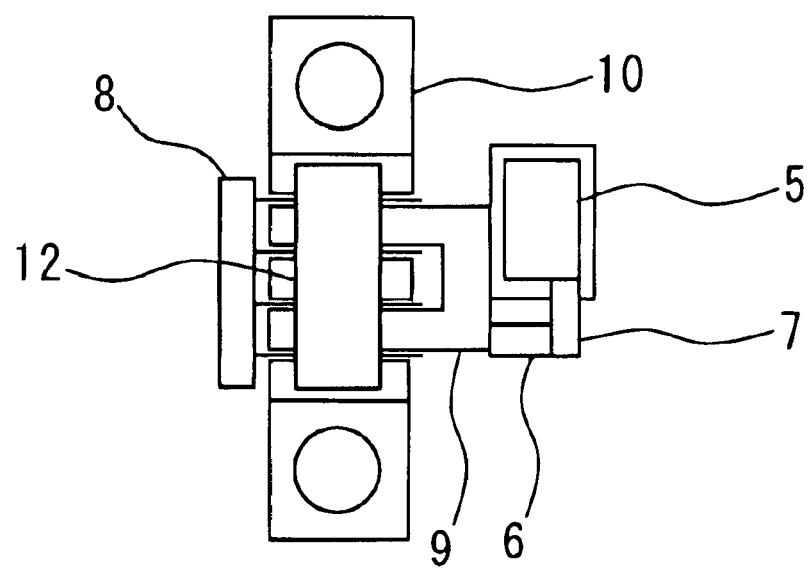
FIG. 7B shows the layout of a transistor cell according to the sixth embodiment.
Figure 8A:
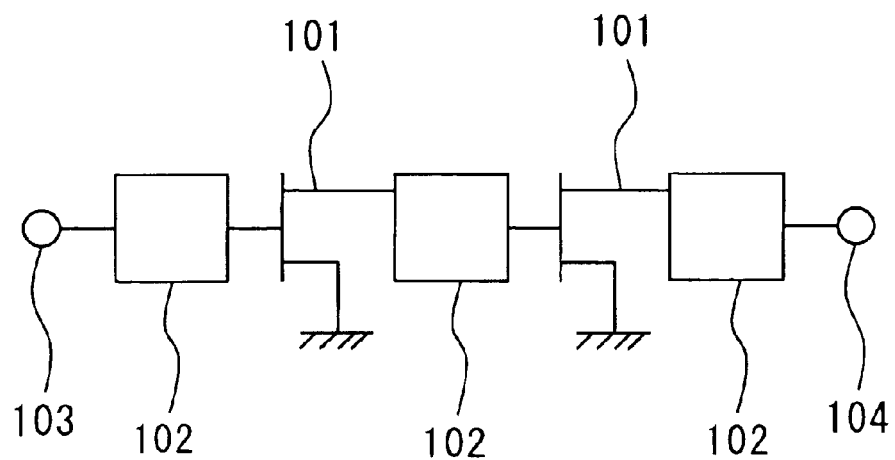
FIGS. 8A–8C show a conventional method of designing an amplifier.
Figure 8B:
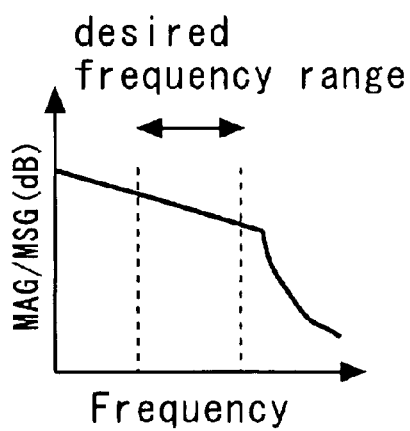
Figure 8C:
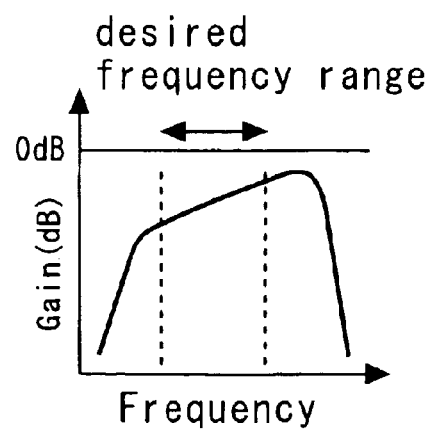

FIG. 7A shows the circuit configuration of a transistor cell 22 according to this embodiment. A circuit formed by connecting a capacitor 5 and a series connection of a resistor 6 and an inductor 7 in parallel is connected to a drain electrode side of a transistor 3. FIG. 7B shows the on-substrate layout of the transistor cell 22. FIG. 7B shows how the capacitor 5, the resistor 6, and the inductor 7 are formed close to the drain electrode 9.

The transistor cell 22 according to this embodiment can realize a stable, flat MAG characteristic. Further, since no loss-inducing element such as a resistor is disposed on the gate electrode side, the transistor cell 22 according to this embodiment has an advantage of a low noise level.

The main feature of the embodiment is that a semiconductor integrated circuit is designed in such a manner that a transistor cell is designed first as a combination of a transistor and passive elements such as a resistor(s), a capacitor (s), and an inductor(s) and then the transistor cell thus designed is combined with other circuits such as matching circuits. The circuit configurations and the layouts of the transistor cell described in the above embodiments are just examples. That is, the scope of the invention covers all semiconductor integrated circuits having a transistor cell that has been so designed as to operate stably (i.e., does not oscillate) and have a flat MAG characteristic.

In a semiconductor integrated circuit designing method according to the invention, the whole circuit is designed in such a manner that a transistor cell is designed first by combining a transistor with prescribed elements, then matching circuits for the transistor cell are designed, and finally the transistor cell is combined with the matching circuits. Since the transistor cell is so designed as to operate stably by itself and have a flat MAG characteristic in a desired frequency range, it is not necessary to control the characteristics of matching circuits so as to compensate the characteristic of a transistor cell as is done conventionally. If matching circuits are so designed that a loss occurring there has a flat frequency characteristic, not only the gain characteristic of the entire semiconductor integrated circuit but also its output voltage characteristic is given a flat frequency characteristic. As such, the designing method according to this embodiment makes it possible to design a semiconductor integrated circuit having a stable, flat gain characteristic in a wide frequency range easily with a small load of designing.

A semiconductor device according to this embodiment can be designed relatively easily by combining a transistor cell with other circuits according to the above designing method, and its manufacturing cost and price can be reduced.

In particular, if a transistor cell is so designed as to have a maximum available gain characteristic that is flat (deviation: within 1 dB) in a desired frequency range, it can easily be combined with other circuits.

It is further understood that the foregoing description is a preferred embodiment of the disclosed apparatus and that various changes and modifications may be made in the invention without departing from the spirit and scope thereof.

The entire disclosure of a Japanese Patent Application No. 2001-332994, filed on Oct. 30, 2001 including specification, claims drawings and summary, on which the Convention priority of the present application is based, are incorporated herein by reference in its entirety.

What is claimed is:

1. A method of designing a semiconductor integrated circuit that operates in a wide frequency range, comprising:

designing a transistor cell as a combination of a transistor and passive circuit elements by determining parameters of the passive circuit elements so that the transistor cell has a maximum available gain characteristic that is flat in a desired frequency range;

designing matching circuits for input and output impedance matching for the transistor cell so that loss of the matching circuits has a flat frequency characteristic; and combining the transistor cell and the matching circuits in a semiconductor integrated circuit.

2. A semiconductor device having a semiconductor integrated circuit that operates in a wide frequency range, the semiconductor integrated circuit comprising:

a transistor cell comprising a transistor and passive circuit elements, the passive circuit elements having parameters determined so that the transistor cell has a maximum available gain characteristic that is flat in a desired frequency range; and matching circuits for input and output impedance matching the transistor cell, the matching circuits having a loss with a flat frequency characteristic.

3. The semiconductor device according to claim 2, wherein the maximum available gain characteristic of the transistor cell is flat in the desired frequency range within 1 dB.

4. The semiconductor device according to claim 2, wherein the transistor cell has a stability factor k that is at least 1.

5. The semiconductor device according to claim 2, wherein the passive circuit elements include a feedback circuit for the transistor cell.

6. The semiconductor device according to claim 5, wherein at least one of the passive circuit elements of the feedback circuit is disposed close to a drain electrode of the transistor.

7. The semiconductor device according to claim 5, wherein at least one of the passive circuit elements of the feedback circuit is disposed close to a gate electrode of the transistor.

8. The semiconductor device according to claim 2, wherein a circuit of the passive circuit elements is located on a gate electrode side of the transistor.

9. The semiconductor device according to claim 8, wherein the circuit located on the gate electrode side includes a capacitor connected in parallel to a series connection of an inductor and a resistor.

10. The semiconductor device according to claim 8, wherein the circuit located on the gate electrode side includes a first capacitor connected in parallel to a series connection of an inductor and a resistor and a grounded second capacitor connected to a gate electrode of the transistor.

11. The semiconductor device according to claim 11, wherein a circuit of the passive circuit elements is located on a drain electrode side of the transistor.

12. The semiconductor device according to claim 11, wherein the circuit located on the drain electrode side includes a capacitor connected in parallel to a series connection of an inductor and a resistor.

13. The semiconductor device according to claim 2, including a plurality of the transistor cells combined with each other as a power amplifier.

* * * * *